(12) United States Patent
Shi

(10) Patent No.: US 10,700,102 B2
(45) Date of Patent: Jun. 30, 2020

(54) ARRAY SUBSTRATE AND MANUFACTURING METHOD THEREOF, AND DISPLAY DEVICE

(71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 332 days.

(21) Appl. No.: 15/740,008

(22) PCT Filed: Nov. 23, 2017

(86) PCT No.: PCT/CN2017/112628
§ 371 (c)(1),
(2) Date: Dec. 27, 2017

(87) PCT Pub. No.: WO2019/052008
PCT Pub. Date: Mar. 21, 2019

(65) Prior Publication Data
US 2020/0043947 A1 Feb. 6, 2020

(30) Foreign Application Priority Data
Sep. 18, 2017 (CN) .......................... 2017 1 0846528

(51) Int. Cl.
*H01L 27/12* (2006.01)
*H01L 21/02* (2006.01)
(Continued)

(52) U.S. Cl.
CPC ...... *H01L 27/124* (2013.01); *H01L 21/02164* (2013.01); *H01L 21/02266* (2013.01);
(Continued)

(58) Field of Classification Search
CPC ................. H01L 27/124; H01L 27/127; H01L 29/78633; H01L 21/02565; H01L 29/66969; H01L 27/1225
See application file for complete search history.

(56) References Cited

U.S. PATENT DOCUMENTS 6,038,004 A 3/2000 Nanno et al.
2008/0012022 A1* 1/2008 Moriwaki ............. H01L 29/458
257/72
(Continued)

FOREIGN PATENT DOCUMENTS

CN  1967814 A  5/2007
CN  107093618 A  8/2017

*Primary Examiner* — Julia Slutsker
(74) *Attorney, Agent, or Firm* — Andrew C. Cheng

(57) ABSTRACT

The present invention provides an array substrate and a manufacturing method thereof, and a display device. The array substrate comprises a base substrate, a metal pattern layer, a data line pattern layer, and a scan line pattern layer. Wherein, the data line pattern layer or the scan line pattern layer and the metal pattern layer are arranged in different layers and are directly connected to the metal pattern layer. So that the data line pattern layer or the scan line pattern layer and the metal pattern layer are formed a parallel structure. Because the resistance of the parallel structure is smaller than the resistance of the data line pattern layer or the scan line pattern layer, the resistance of the parallel structure when is used as a data line or a scan line, is reduced, thereby the display effect is improved.

18 Claims, 3 Drawing Sheets

(51) Int. Cl.
*H01L 29/66* (2006.01)
*H01L 29/786* (2006.01)

(52) U.S. Cl.
CPC .. *H01L 21/02565* (2013.01); *H01L 21/02631* (2013.01); *H01L 27/127* (2013.01); *H01L 27/1218* (2013.01); *H01L 27/1225* (2013.01); *H01L 27/1262* (2013.01); *H01L 29/66969* (2013.01); *H01L 29/7869* (2013.01); *H01L 29/78633* (2013.01)

(56) References Cited

U.S. PATENT DOCUMENTS

| | | | |
|---|---|---|---|
| 2009/0147168 A1* | 6/2009 | Lu | H01L 27/124 349/43 |
| 2016/0155755 A1* | 6/2016 | Liu | H01L 27/124 257/72 |
| 2016/0240687 A1 | 8/2016 | Hu et al. | |
| 2017/0033233 A1* | 2/2017 | Yamazaki | H01L 29/7869 |
| 2017/0212397 A1 | 7/2017 | Cao | |
| 2018/0331228 A1* | 11/2018 | Oikawa | H01L 27/124 |

\* cited by examiner

ARRAY SUBSTRATE AND MANUFACTURING METHOD THEREOF, AND DISPLAY DEVICE

FIELD OF THE INVENTION

The present invention relates to a technology of display, and more particularly, to an array substrate and a manufacturing method thereof, and a display device.

DESCRIPTION OF PRIOR ART

With the development of science and technology, the size of the display is larger and larger, but the data lines and the scan lines in the large-size display have a large resistance and capacitive load. Too large resistance and capacitive load causes a delay in the output waveform and causes an abnormal display.

SUMMARY OF THE INVENTION

The present invention mainly provides an array substrate and a manufacturing method thereof, and a display device, to solve the abnormal display problem caused by too large resistance of data line or scan line.

In order to solve the above-mentioned technical problem, a technical solution adopted by the present invention is to provide an array substrate, wherein the array substrate comprises a base substrate, a metal pattern layer, a data line pattern layer, and a scan line pattern layer; wherein the metal pattern layer is arranged on the base substrate, the data line pattern layer and the metal pattern layer are arranged in different layers and is directly connected to the metal pattern layer, or the scan line pattern layer and the metal pattern layer are arranged in different layers and is directly connected to the metal pattern layer.

In order to solve the above-mentioned technical problem, a technical solution adopted by the present invention is further to provide a display device, wherein the display device comprises an array substrate, which comprises a base substrate, a metal pattern layer, a data line pattern layer, and a scan line pattern layer; wherein the metal pattern layer is arranged on the base substrate, the data line pattern layer and the metal pattern layer are arranged in different layers and is directly connected to the metal pattern layer, or the scan line pattern layer and the metal pattern layer are arranged in different layers and is directly connected to the metal pattern layer.

In order to solve the above-mentioned technical problem, a technical solution adopted by the present invention is more further to provide a manufacturing method for array substrate, wherein the method comprises: depositing metals on the base substrate to form a metal pattern layer and a light shielding layer which having an interval there between; forming a buffer layer covering the metal pattern layer and opening a first through hole penetrating the buffer layer and connecting to the metal pattern layer; forming an active layer and a first insulating layer sequentially and stackedly on the buffer layer; forming a gate pattern layer and a scan line pattern layer on the first insulating layer and the buffer layer by the same photolithography process, respectively, the scan line pattern layer directly connected to the metal pattern layer via the first through hole; forming a second insulating layer on the buffer layer; forming a source pattern layer, a drain pattern layer and a data line pattern layer on the second insulating layer.

The present invention can be concluded with the following advantages, the method provided by the present invention is different by a method that arranging the metal pattern layer on the base substrate, and the data line pattern layer and the metal pattern layer are arranged in different layers and is directly connected to the metal pattern layer, or the scan line pattern layer and the metal pattern layer are arranged in different layers and is directly connected to the metal pattern layer, so that the data line pattern layer or the scan line pattern layer and the metal pattern layer are formed a parallel structure. Because the resistance of the parallel structure is smaller than the resistance of the data line pattern layer or the scan line pattern layer, the resistance of the parallel structure when is used as a data line or a scan line, is reduced, thereby the display effect is improved.

DESCRIPTION OF PREFERRED EMBODIMENT

Technical implementation will be described below clearly and fully by combining with drawings made in accordance with an embodiment in the present invention.

Figure 1:
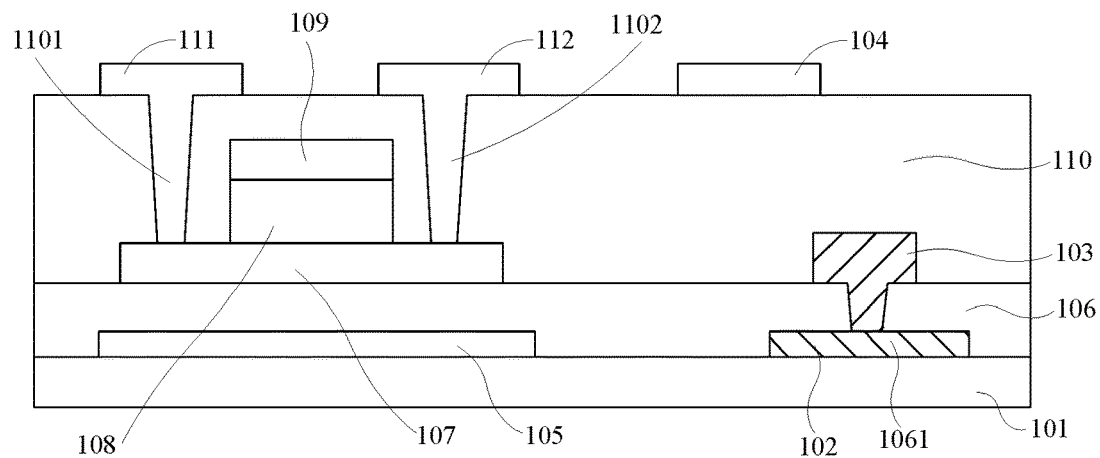
FIG. 1 is a structural illustration of an array substrate in accordance with the first embodiment in the present invention.

Referring to FIG. 1, an array substrate provided by the first embodiment in the present invention comprises a base substrate 101, a metal pattern layer 102, a scan line pattern layer 103, and a data line pattern layer 104.

Wherein the metal pattern layer 102 is arranged on the base substrate 101, further, a light shielding layer 105 is further arranged on the base substrate 101, and the light shielding layer 105 and the metal pattern layer 102 are arranged in the same layer by the same photolithography process and have an interval there between.

Specifically, it may deposit a metal material layer on the base substrate 101 by a physical vapor deposition method or a plasma vapor deposition method, and then the metal pattern layer 102 and the light shielding layer 105 are simultaneously formed on the base substrate 101 by photolithography process of exposure, development, etching, and lift-off.

Optionally, the metal material of the metal material layer is a metal material including but not limited to aluminum or molybdenum.

Further, the scan line pattern layer 103 is directly connected to the metal pattern layer 102.

Specifically, a buffer layer 106 covering the metal pattern layer 102 is further arranged on the base substrate 101, and a first through hole 1061 penetrating the buffer layer 106 and connecting to the metal pattern layer 102 is arranged in the buffer layer 106. Specifically, a silicon oxide layer covering the metal pattern layer 102 may be deposited on the base substrate 101 to form the buffer layer 106 by physical vapor deposition method or plasma vapor deposition method. After the buffer layer 106 is formed, the first through hole 1061 connecting to the metal pattern layer 102 is etched in the buffer layer 106 by photolithography process of exposure, development, etching and lift-off, and the scan line pattern layer 103 is arranged on the buffer layer 106 to directly connect to the metal pattern layer 102 via the first through hole 1061.

Further, an active layer 107, a first insulating layer 108 and a gate pattern layer 109 are sequentially and stackedly arranged on the buffer layer 106. Wherein, the scan line pattern layer 103 and the gate pattern layer 109 are formed by the same photolithography process.

Specifically, depositing indium gallium zinc oxide (IGZO) by physical vapor deposition at a position opposite to the light shielding layer 105 on the buffer layer 106. Then, an IGZO pattern is formed on the buffer layer 106 by photolithography process of exposure, development, etching, and lift-off, to form the active layer 107. Further, depositing silicon oxide on the active layer 107 by physical vapor deposition method, and then to form the first insulating layer 108 by photolithography process of exposure, development, etching, and lift-off. Depositing a metal material on the first insulating layer 108, on the buffer layer 106, and in the first through hole 1061, and then to form respectively a gate pattern layer 109 and a scan line pattern layer 103 on the first insulating layer 108 and the buffer layer 106 by photolithography process of exposing, developing, etching and peeling. In this case, the scan line pattern layer 103 formed on the buffer layer 106 can be directly connected to the metal pattern layer 102 via the metal material in the first through hole 1061.

Optionally, the metal material is a metal material including but not limited to aluminum or molybdenum.

Further, a second insulating layer 110 covering the gate pattern layer 109 is further arranged on the buffer layer 106, and a source pattern layer 111 and a drain pattern layer 112 is arranged on the second insulating layer 110. Wherein the data line pattern layer 104, the source pattern layer 111, and the drain pattern layer 112 are formed by the same photolithography process.

Specifically, it may deposit silicon oxide on the buffer layer 106 by physical vapor deposition, and the second insulating layer 110 covering the gate pattern layer 109 is formed on the buffer layer 106 by photolithography process of exposure, development, etching, and lift-off. Then, a source through hole 1101 and a drain through hole 1102 connecting the active layer 107 are opened in the second insulating layer 110 by photolithography process of exposure, development, etching and lift-off. Finally, it may deposit a metal material on the second insulating layer 110, in the source through hole 1101, and in the drain through hole 1102 by physical vapor deposition method or plasma vapor deposition method, and the source pattern layer 111, the drain pattern layer 112, and the data line pattern layer 104 are simultaneously formed by photolithography process of exposure, development, etching and lift-off.

In the present embodiment, the scan line pattern layer 103 is directly connected to the metal pattern layer 102 via the first through hole 1061 on the buffer layer 106, to form a parallel structure with the metal pattern layer 102, so that the resistance of the parallel structure formed by the scan line pattern layer 103 and the metal pattern 102, is smaller than the resistance of the scan line pattern layer 103.

Figure 2:
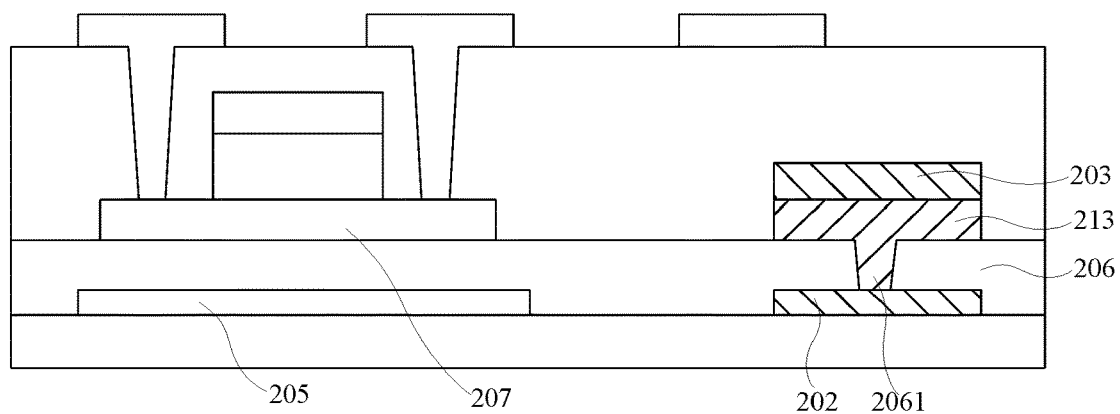
FIG. 2 is a structural illustration of an array substrate in accordance with the second embodiment in the present invention.

Referring to FIG. 2, an array substrate provided by the second embodiment in the present invention further comprises a first conductive layer 213. The first conductive layer 213 and an active layer 207 are arranged in the same layer by the same photolithography process and have an interval there between, and are directly connected to a metal pattern layer 202 via a first through hole 2061.

Specifically, when the active layer 207 is formed as in the first embodiment described above, depositing IGZO on a buffer layer 206 and in the first through hole 2061 by physical vapor deposition method, then two IGZO patterns are formed on the buffer layer 206 by photolithography process of exposure, development, etching, and lift-off. Wherein in the position opposite to alight shielding layer 205 is the active layer 207 and in the position of the first through hole 2061 is the first conductive layer 213. The first conductive layer 213 is directly connected to the metal pattern layer 202 via the IGZO in the first through hole 2061.

Further, in the present embodiment, a scan line pattern layer 203 is arranged on the first conductive layer 213, so that the scan line pattern layer 203 is directly connected to the metal pattern layer 202 via the first conductive layer 213, to form a parallel structure with the first conductive layer 213 and the metal pattern layer 202. The resistance of the parallel structure is smaller than the resistance of the scan line pattern layer 203.

The other structures in the present embodiment are the same as those in the first embodiment described above, therefore no additional description is given here below.

Figure 3:
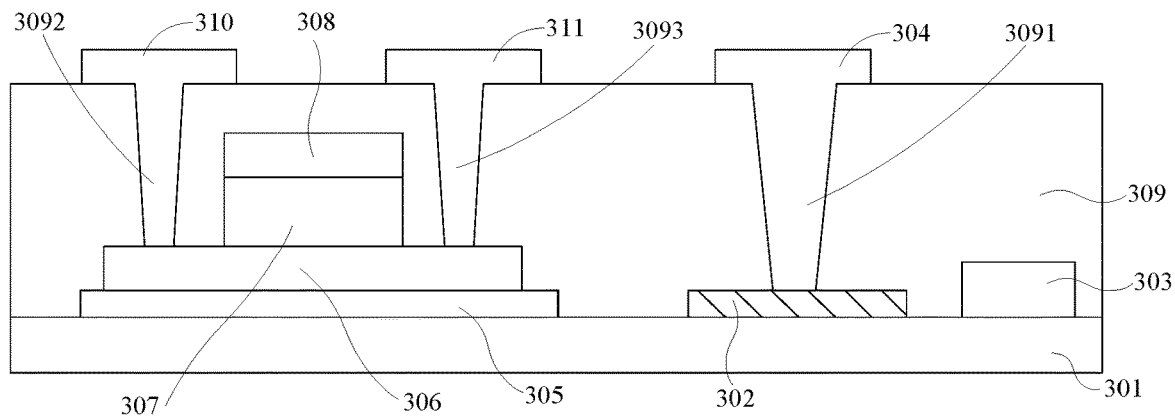
FIG. 3 is a structural illustration of an array substrate in accordance with the third embodiment in the present invention.

Referring to FIG. 3, an array substrate provided by the third embodiment in the present invention comprises a base substrate 301, a metal pattern layer 302, a scan line pattern layer 303, and a data line pattern layer 304.

Wherein the metal pattern layer 302 is arranged on the base substrate 301, further, a light shielding layer 305 is further arranged on the base substrate 301, and the light shielding layer 305 and the metal pattern layer 302 are arranged in the same layer by the same photolithography process and have an interval there between.

Specifically, it may deposit a metal material layer may on the base substrate 301 by a physical vapor deposition method or a plasma vapor deposition method, and then the metal pattern layer 302 and the light shielding layer 305 are simultaneously formed on the base substrate 301 by photolithography process of exposure, development, etching, and lift-off.

Optionally, the metal material of the metal material layer is a metal material including but not limited to aluminum or molybdenum.

Further, an active layer 306, a first insulating layer 307 and a gate pattern layer 308 are sequentially and stackedly arranged on the light shielding layer 305. The scan line pattern layer 303 is arranged on the base substrate 301 and formed by the same photolithography process as the gate pattern layer 308.

Specifically, it may deposit IGZO on the light shielding layer by physical vapor deposition method, and then an IGZO pattern is formed by photolithography process of exposure, development, etching, and lift-off, to form the active layer 306. Further, depositing silicon oxide on the active layer 306 by physical vapor deposition method, and then the first insulating layer 307 is formed by photolithography process of exposure, development, etching, and lift-off. Depositing a metal material on the first insulating layer 307 and the base substrate 301, and then the gate pattern layer 308 and scan line pattern layer 303 are formed respectively on the first insulating layer 307 and the base substrate 301, by photolithography process of exposure, development, etching, and lift-off.

The array substrate of the present embodiment further comprises a second insulating layer 309, and a source pattern layer 310 and a drain pattern layer 311 arranged on the second insulating layer 309. The data line pattern layer 304 is arranged on the second insulating layer 309. The data line pattern layer 304, the source pattern layer 310 and the drain pattern layer 311 are formed by the same photolithography process. Wherein, a second through hole 3091 penetrating the second insulating layer 309 and connecting to the metal pattern layer 302 is arranged in the second insulating layer 309. The data line pattern layer 304 is directly connected to the metal pattern layer 302 via the second through hole 3091.

Specifically, it may deposit a silicon nitride covering the gate pattern layer 308 on the base substrate 301 by physical vapor deposition, to form the second insulating layer 309 by photolithography process of exposure, development, etching, and lift-off. Then, a second through hole 3091 penetrating the second insulation layer 309 and connecting to the metal pattern layer 302, a source through hole 3092 and a drain through hole 3093 connecting to the active layer 306, are opened by photolithography process of exposure, development, etching, and lift-off. Finally, depositing a metal material on the second insulating layer 309, in the second through hole 3091, in the source through hole 3092, and in the drain through hole 3093, to simultaneously form the source pattern layer 310, the drain pattern layer 311, and the data line pattern layer 304 on the second insulating layer 309 by photolithography process of exposure, development, etching, and lift-off. The data line pattern layer 304 can be directly connected to the metal pattern layer 302 via the metal material in the second through hole 3091, to form a parallel structure with the metal pattern layer 302. The resistance of the parallel structure is smaller than the resistance of the data line pattern layer 304.

Figure 4:
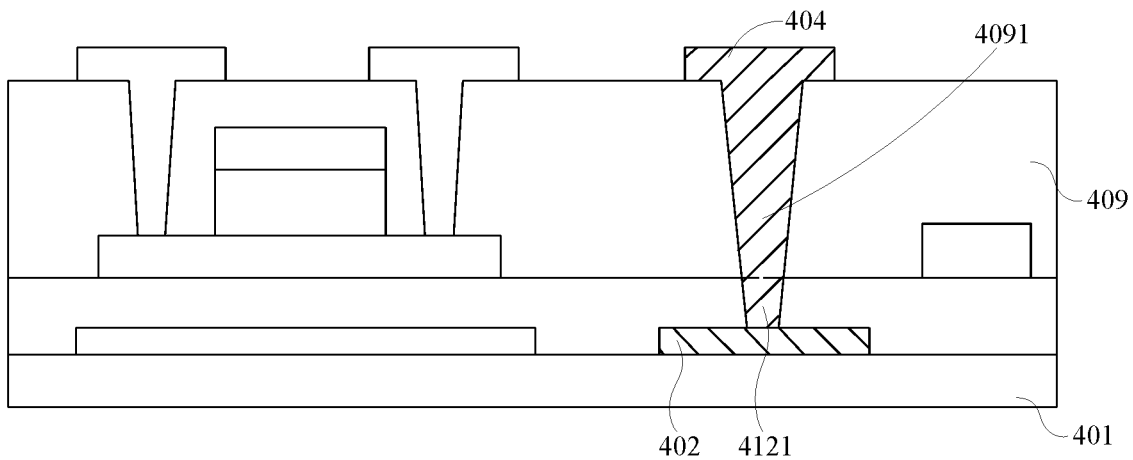
FIG. 4 is a structural illustration of an array substrate in accordance with the fourth embodiment in the present invention.

Referring to FIG. 4, an array substrate provided by the fourth embodiment in the present invention further comprises a buffer layer 412. The buffer layer 412 covering the metal pattern layer 402 is arranged on the base substrate 401.

Wherein, a third through hole 4121 penetrating the buffer layer 412 and connecting to the metal pattern layer 402 is arranged in the buffer layer 412. Further, a second insulating layer 409 is arranged on the buffer layer 412, and a second through hole 4091 is connecting to the third through hole 4121, so that a data line pattern layer 404 is directly connected to the metal pattern layer 402 via the second through hole 4091 and the third through hole 4121.

Specifically, when the data line pattern layer 404 is formed as in the third embodiment described above, simultaneously depositing a metal material in the second through hole 4091 and the third through hole 4121, so that the metal material in the second through hole 4091 and the third through hole 4121 can be directly connected to the metal pattern layer 402, when the data line pattern layer 404 is formed.

The other structures in the present embodiment are the same as those in the third embodiment described above, therefore no additional description is given here below.

Figure 5:
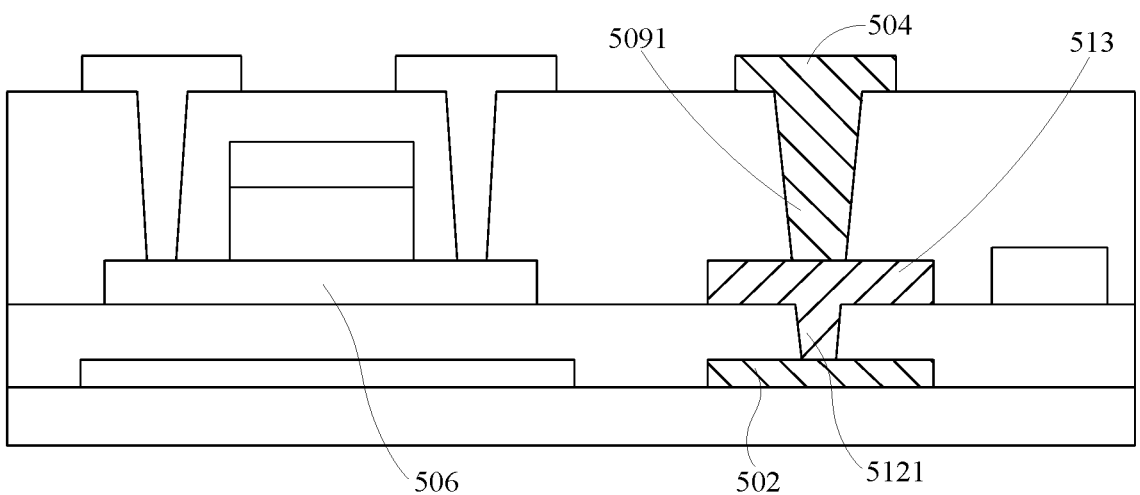
FIG. 5 is a structural illustration of an array substrate in accordance with the fifth embodiment in the present invention.

Referring to FIG. 5, an array substrate provided by the fifth embodiment in the present invention further comprises a second conductive layer 513. The second conductive layer 513 is arranged at a distance from an active layer 506 and formed by the same photolithography process, and the second conductive layer 513 is located between a second through hole 5091 and a third through hole 5121, so that a data line pattern layer 504 is directly connected to a metal pattern layer 502 via the second conductive layer 513.

Specifically, when the active layer 506 is formed as in the third embodiment described above, simultaneously depositing IGZO in the third through hole 5121, and then the active layer 506 and the second conductive layer 513 are simultaneously formed by photolithography process of exposure, development, etching, and lift-off. The second conductive layer 513 can be directly connected to the metal pattern layer 502 via the IGZO in the third through hole 5121. Similarly, when the data line pattern layer 504 is formed, the data line pattern layer 504 is directly connected to the second conductive layer 513 via the second through hole 5091, so that the data line pattern layer 504 is directly connected to the metal pattern layer 502 via the second conductive layer 513.

In the present embodiment, the data line pattern layer 504 is directly connected to the metal pattern layer 502 via the second conductive layer 513, to form a parallel structure with the second conductive layer 513 and the metal pattern layer 502. The resistance of the parallel structure is smaller than the resistance of the scan line pattern layer 504.

The other structures in the present embodiment are the same as those in the fourth embodiment described above, therefore no additional description is given here below.

Figure 6:
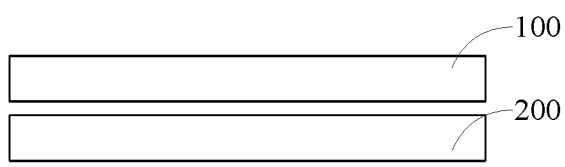
FIG. 6 is a structural illustration of a display device in accordance with the first embodiment in the present invention.

Referring to FIG. 6, a display device provided by the present invention comprises a backlight module 100 and an array substrate 200 in any one of the above-mentioned embodiments.

Figure 7:
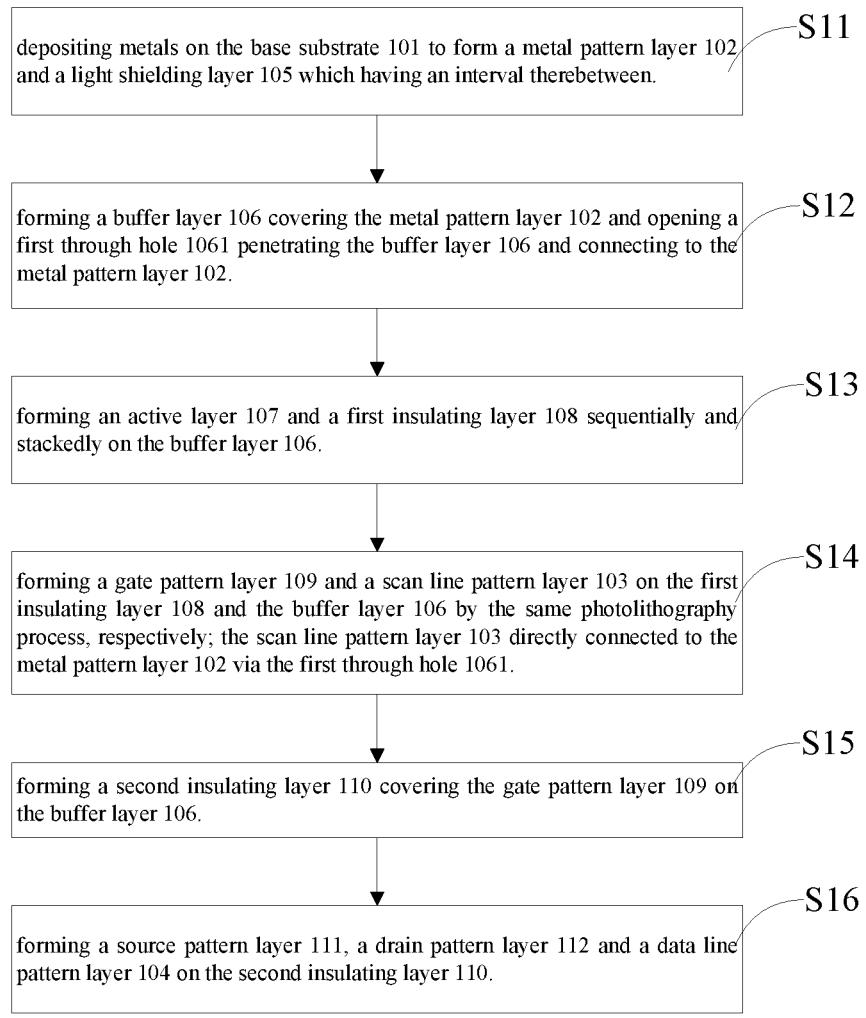
FIG. 7 is a flow chart of a manufacturing method for array substrate in accordance with an embodiment in the present invention.

Referring to FIG. 1 an FIG. 7, a manufacturing method for array substrate provided by the present invention comprises:

S11: depositing metals on the base substrate 101 to form a metal pattern layer 102 and a light shielding layer 105 which having an interval there between.

S12: forming a buffer layer 106 covering the metal pattern layer 102 and opening a first through hole 1061 penetrating the buffer layer 106 and connecting to the metal pattern layer 102.

S13: forming an active layer 107 and a first insulating layer 108 sequentially and stackedly on the buffer layer 106.

S14: forming a gate pattern layer 109 and a scan line pattern layer 103 on the first insulating layer 108 and the buffer layer 106 by the same photolithography process, respectively; the scan line pattern layer 103 directly connected to the metal pattern layer 102 via the first through hole 1061.

S15: forming a second insulating layer 110 covering the gate pattern layer 109 on the buffer layer 106.

S16: forming a source pattern layer 111, a drain pattern layer 112 and a data line pattern layer 104 on the second insulating layer 110.

The detailed implementation method of each step in the present embodiment may be referred to the description of the array substrate in the first embodiment, therefore no additional description is given here below.

The method provided by the present invention is different by a method that arranging the metal pattern layer on the base substrate, and the data line pattern layer and the metal pattern layer are arranged in different layers and is directly connected to the metal pattern layer, or the scan line pattern layer and the metal pattern layer are arranged in different layers and is directly connected to the metal pattern layer, so that the data line pattern layer or the scan line pattern layer and the metal pattern layer are formed a parallel structure. Because the resistance of the parallel structure is smaller than the resistance of the data line pattern layer or the scan line pattern layer, the resistance of the parallel structure when is used as a data line or a scan line, is reduced, thereby the display effect is improved.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. An array substrate, wherein the array substrate comprises a base substrate, a metal pattern layer, a data line pattern layer, and a scan line pattern layer;
    wherein the metal pattern layer is arranged on the base substrate, the data line pattern layer and the metal pattern layer are arranged in different layers and the data line pattern layer is directly connected to the metal pattern layer, or the scan line pattern layer and the metal pattern layer are arranged in different layers and the scan line pattern layer is directly connected to the metal pattern layer;
    wherein a light shielding layer is arranged on the base substrate, the metal pattern layer and the light shielding layer are arranged in a same layer by a same photolithography process and have an interval there between;
    wherein the array substrate further comprises a second insulating layer, and comprises a source pattern layer and a drain pattern layer arranged on the second insulating layer, the data line pattern layer is arranged on the second insulating layer; the data line pattern layer, the source pattern layer, and the drain pattern layer are formed by a same photolithography process; and the second insulating layer defines a second through hole penetrating the second insulating layer and connecting to the metal pattern layer, and the data line pattern layer is directly connected to the metal pattern layer via the second through hole;
    wherein the data line pattern layer is located at a side of the metal pattern layer toward the second insulating layer and comprises a first portion and a second portion connected with each other and arranged along a direction away from the base substrate, the first portion is located in the second through hole, the second portion is located at a side of the second insulating layer away from the metal pattern layer.

2. The array substrate as recited in claim 1, which is characterized in that a buffer layer covering the metal pattern layer is arranged on the base substrate; an active layer, a first insulating layer and a gate pattern layer are sequentially and stackedly arranged on the buffer layer; and the scan line pattern layer and the gate pattern layer are formed by a same photolithography process.

3. The array substrate as recited in claim 2, wherein the buffer layer defines a first through hole penetrating the buffer layer and connecting to the metal pattern layer, and the scan line pattern layer is directly connected to the metal pattern layer via the first through hole.

4. The array substrate as recited in claim 3, where in a first conductive layer is further arranged on the buffer layer at a distance from the active layer and formed by a same photolithography process, the first conductive layer is directly connected to the metal pattern via the first through hole, and the scan line pattern layer is arranged on the first conductive layer.

5. The array substrate as recited in claim 1, wherein a buffer layer covering the metal pattern layer is sandwiched between the second insulating layer and the base substrate, the second insulating layer is arranged on the buffer layer, and the buffer layer defines a third through hole penetrating the buffer layer and connecting to the metal pattern layer, so that the data line pattern layer is directly connected to the metal pattern layer via the third through hole and the second through hole.

6. The array substrate as recited in claim 5, wherein an active layer and a second conductive layer are arranged on the buffer layer; the second conductive layer is arranged at a distance from the active layer and formed by the same photolithography process; and the second conductive layer is located between the second through hole and the third through hole, so that the data line pattern layer is directly connected to the metal pattern layer via the second conductive layer.

7. A display device, wherein the display device comprises an array substrate, which comprises a base substrate, a metal pattern layer, a data line pattern layer, and a scan line pattern layer;
    wherein the metal pattern layer is arranged on the base substrate, the data line pattern layer and the metal pattern layer are arranged in different layers and the data line pattern layer is directly connected to the metal pattern layer, or the scan line pattern layer and the metal pattern layer are arranged in different layers and the scan line pattern layer is directly connected to the metal pattern layer;
    wherein a light shielding layer is arranged on the base substrate, the metal pattern layer and the light shielding layer are arranged in a same layer by a same photolithography process and have an interval there between;
    wherein the array substrate further comprises a second insulating layer, and comprises a source pattern layer and a drain pattern layer arranged on the second insulating layer, the data line pattern layer is arranged on the second insulating layer; the data line pattern layer, the source pattern layer, and the drain pattern layer are formed by a same photolithography process; and the second insulating layer defines a second through hole penetrating the second insulating layer and connecting to the metal pattern layer, and the data line pattern layer is directly connected to the metal pattern layer via the second through hole;
    wherein the data line pattern layer is located at a side of the metal pattern layer toward the second insulating layer and comprises a first portion and a second portion connected with each other and arranged along a direction away from the base substrate, the first portion is located in the second through hole, the second portion is located at a side of the second insulating layer away from the metal pattern layer.

8. The display device as recited in claim 7, a buffer layer covering the metal pattern layer is arranged on the base substrate; an active layer, a first insulating layer and a gate pattern layer are sequentially and stackedly arranged on the buffer layer; and the scan line pattern layer and the gate pattern layer are formed by a same photolithography process.

9. The display device as recited in claim 8, wherein the buffer layer defines a first through hole penetrating the buffer layer and connecting to the metal pattern layer, and the scan line pattern layer is directly connected to the metal pattern layer via the first through hole.

10. The display device as recited in claim 9, wherein a first conductive layer is further arranged on the buffer layer at a distance from the active layer and formed by a same photolithography process, the first conductive layer is directly connected to the metal pattern via the first through hole, and the scan line pattern layer is arranged on the first conductive layer.

11. The display device as recited in claim 7, wherein a buffer layer covering the metal pattern layer is arranged on the base substrate, the second insulating layer is arranged on the buffer layer, and the buffer layer defines a third through hole penetrating the buffer layer and connecting to the metal pattern layer, so that the data line pattern layer is directly connected to the metal pattern layer via the third through hole and the second through hole.

12. The display device as recited in claim 11, wherein an active layer and a second conductive layer are arranged on the buffer layer; the second conductive layer is arranged at a distance from the active layer and formed by the same photolithography process; and the second conductive layer is located between the second through hole and the third through hole, so that the data line pattern layer is directly connected to the metal pattern layer via the second conductive layer.

13. A manufacturing method for array substrate, wherein the method comprises:
- depositing metals on the base substrate to form a metal pattern layer and a light shielding layer having an interval there between;
- forming a buffer layer covering the metal pattern layer and opening a third first through hole penetrating the buffer layer and connecting to the metal pattern layer;
- forming an active layer and a first insulating layer sequentially and stackedly on the buffer layer;
- forming a gate pattern layer and a scan line pattern layer on the first insulating layer and the buffer layer by a same photolithography process, respectively;
- forming a second insulating layer on the buffer layer wherein the second insulating layer defines a second through hole penetrating the second insulating layer and communicated with the third through hole; and
- forming a source pattern layer, a drain pattern layer and a data line pattern layer on the second insulating layer, wherein the data line pattern layer is directly connected to the metal pattern layer via the second through hole and the third through hole;

wherein the data line pattern layer is located at a side of the metal pattern layer toward the second insulating layer and comprises a first portion and a second portion connected with each other and arranged along a direction away from the base substrate, the first portion is located in the second through hole, the second portion is located at a side of the second insulating layer away from the metal pattern layer.

14. The array substrate as recited in claim 5, wherein the second through hole and the third through hole are communicated along a radial direction such that a central axis of the second through hole and a central axis of the third through hole are arranged in a same line.

15. The array substrate as recited in claim 6, wherein the second conductive layer comprise a first part and a second part connected with each other and arranged along a direction away from the base substrate, the first part is located in the second through hole, the second part is sandwiched between the buffer layer and the second insulating layer such that the second part is located at a side of the second insulating toward the metal pattern layer, the metal pattern layer, the second conductive layer and the data line pattern layer are arranged along a direction away from the substrate.

16. The display device as recited in claim 11, wherein the second through hole and the third through hole are communicated along a radial direction such that a central axis of the second through hole and a central axis of the third through hole are arranged in a same line.

17. The display device as recited in claim 12, wherein the second conductive layer comprise a first part and a second part connected with each other and arranged along a direction away from the base substrate, the first part is located in the second through hole, the second part is sandwiched between the buffer layer and the second insulating layer such that the second part is located at a side of the second insulating toward the metal pattern layer, the metal pattern layer, the second conductive layer and the data line pattern layer are arranged along a direction away from the substrate.

18. The manufacturing method for array substrate as recited in claim 13, wherein the second through hole and the third through hole are communicated along a radial direction such that a central axis of the second through hole and a central axis of the third through hole are arranged in a same line.

* * * * *